United States Patent

Eschauzier et al.

[11] Patent Number: 6,160,450
[45] Date of Patent: Dec. 12, 2000

[54] SELF-BIASED, PHANTOM-POWERED AND FEEDBACK-STABILIZED AMPLIFIER FOR ELECTRET MICROPHONE

[75] Inventors: Rudy G. H. Eschauzier, Spijkenisse; Nico van Riin, Katuijk, both of Netherlands

[73] Assignee: National Semiconductor Corporation, Santa Clara, Calif.

[21] Appl. No.: 09/290,028

[22] Filed: Apr. 9, 1999

[51] Int. Cl.$^7$ .................................................. H03F 3/45
[52] U.S. Cl. ......................... 330/253; 330/260; 381/121
[58] Field of Search .................................. 330/253, 260, 330/261; 323/313, 314; 381/120, 121

[56] References Cited

U.S. PATENT DOCUMENTS

| | | | |
|---|---|---|---|
| Re. 33,309 | 8/1990 | Walker, Jr. et al. | 379/395 |
| 3,987,369 | 10/1976 | Yokoyama | 330/253 |
| 4,361,735 | 11/1982 | Johnson et al. | 179/111 E |
| 4,451,800 | 5/1984 | Nishioka et al. | 330/261 |
| 4,466,120 | 8/1984 | Walker, Jr. et al. | 381/109 |
| 4,583,052 | 4/1986 | Ishii | 330/253 |
| 4,598,253 | 7/1986 | Reindel et al. | 330/253 |
| 4,629,910 | 12/1986 | Early et al. | 307/317 |
| 4,718,083 | 1/1988 | Boeckmann | 379/392 |
| 4,954,769 | 9/1990 | Kalthoff | 330/253 |
| 5,097,224 | 3/1992 | Madaffari et al. | 330/277 |
| 5,239,579 | 8/1993 | Schuh | 379/395 |
| 5,337,011 | 8/1994 | French et al. | 330/258 |
| 5,577,129 | 11/1996 | Ehara | 381/113 |

OTHER PUBLICATIONS

Data Sheet 2SK2219, pp. 1–4.
Data Sheet 2SK1578, pp. 1–4.

*Primary Examiner*—Robert Pascal
*Assistant Examiner*—Khanh Van Nguyen
*Attorney, Agent, or Firm*—Baker & McKenzie

[57] ABSTRACT

A self-biased electret microphone amplifier with phantom powering which avoids the need for JFETs and depletion mode devices, both of which are not standard devices when using BiCMOS fabrication processes. Feedback is included to provide enhanced gain, dynamic range, linearity and temperature stability, without requiring filtering, large resistances or external components. A self-biased, phantom powered, differential MOSFET amplifier receives and pre-amplifies the microphone signal. Further amplification and feedback is provided by a differential amplifier and bipolar output amplifier which operates as a common emitter amplifier for the amplified microphone output signal and as an emitter follower amplifier for the feedback signal.

18 Claims, 3 Drawing Sheets

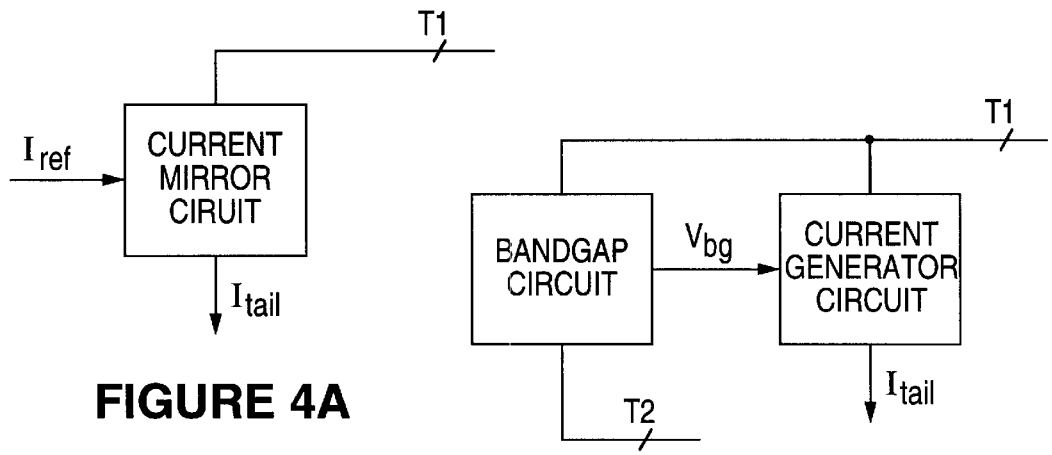
FIGURE 4A
FIGURE 4B
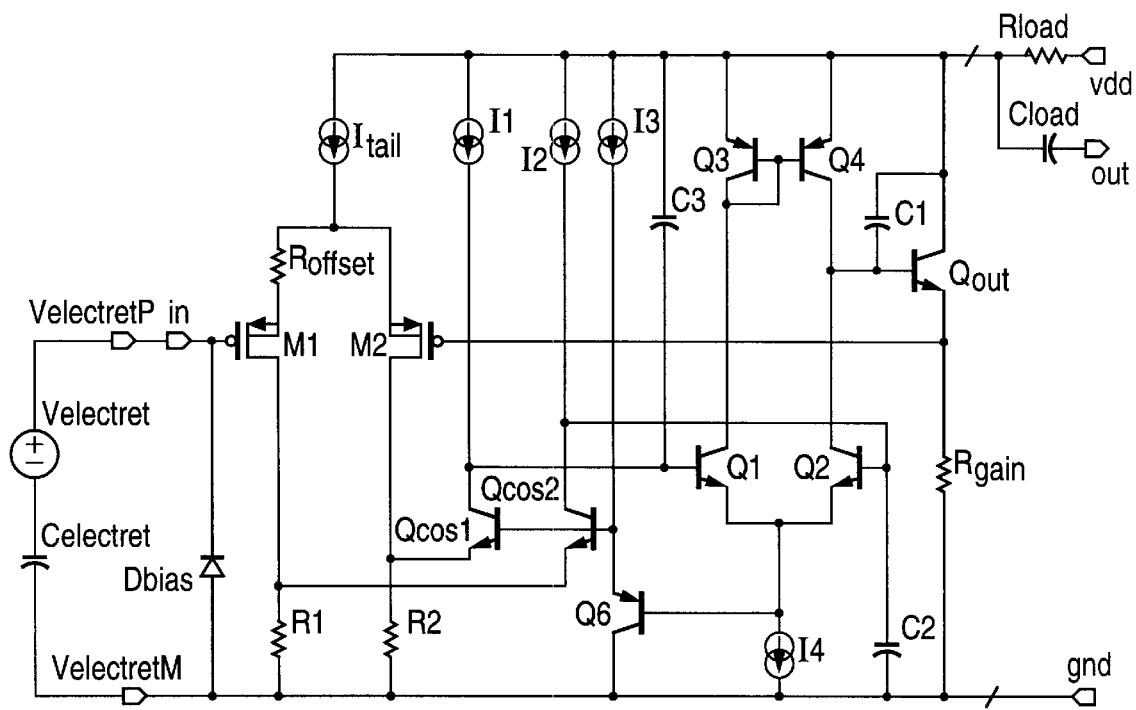
FIGURE 5

SELF-BIASED, PHANTOM-POWERED AND FEEDBACK-STABILIZED AMPLIFIER FOR ELECTRET MICROPHONE

BACKGROUND OF THE INVENTION

1. Field of the Invention

The present invention relates to amplifiers for condenser microphones, and in particular, to self-biased and phantom-powered amplifiers for electret microphones.

2. Description of the Related Art

Approximately 90 percent of all microphone applications presently use electret microphones. This type of condenser microphone has a permanently charged dielectric (electret) between two parallel metal plates (electrodes), one of which is attached to a diaphragm. This diaphragm moves in response to the pressure or particle velocity of sound waves, thereby changing the distance and, therefore, the capacitance, between the diaphragm and its electrode, or backplate. Since the amount of charge is fixed, the voltage between the diaphragm and backplate changes in a manner which is inversely proportional to the change in capacitance in accordance with Equation 1.

$$Q = C*V \tag{1}$$

Referring to FIG. 1, a suitable model for an electret microphone is a capacitor Celectret connected in series with a voltage source Velectret. Because of the high output impedance and lack of current drive, the electret microphone requires buffering for its output signal. In most applications, for reasons of economy, the buffer amplifier is biased using phantom powering, i.e., the buffer amplifier receives its DC power and provides its AC output signal via a shared bias and signal path. This is accomplished by connecting the positive power supply line VDD to the buffer amplifier through a resistor Rload and decoupling the output signal through a coupling capacitor Cload.

The most commonly used device for the buffer amplifier is an N-channel depletion mode JFET (junction field effect transistor) with a reverse biased diode Dbias connected between the gate terminal and circuit ground GND. Because of the high input impedance of the gate terminal of the JFET, the leakage current of the diode Dbias will be sufficient to bias the gate terminal at ground potential GND. Meanwhile, the small signal impedance of the diode Dbias is sufficiently high so as to not affect the AC performance of the circuit.

While such use of a JFET is economical and allows for a compact circuit and since the gate terminal is always at ground potential, the JFET is always biased at the maximum drain current Idss and, therefore, does not require any start-up time to begin amplifying. However, disadvantages include low voltage gain, limited output voltage dynamic range, high total harmonic distortion and large variations in the drain current Idss from one device to another. For example, the voltage gain is typically less than unity which limits the output voltage range to that of the electret microphone (typically around 30 millivolts). This means that an external amplifier is required to increase the output voltage before conveying it to further signal processing circuits.

As for harmonic distortion, with the drain current Idss being a function of the square of the gate-to-source voltage Vgs of the JFET, non-linearity is high, typically around one percent at one kilohertz with 20 millivolts of output voltage. Additionally, variances in the drain current Idss from one device to another, and hence the gain of such devices, is around 50 percent, thereby requiring compensation by providing adjustable gain within the external amplifier.

Referring to FIG. 2, performance of the buffer amplifier can be improved by replacing the JFET with a more complex amplifier circuit. Feedback can be used to control the gain, improve the linearity and compensate for temperature variations. For example, if an operational amplifier is used, as shown, a DC bias loop with a low pass filter (LPF) is needed. Without such bias loop, the amplifier cannot operate as is shown. With the gate of P-type MOSFET (metal oxide semiconductor field effect transistor) M1 at ground potential due to the reverse biased nature of the diode Dbias, the loop gain, represented by Equation 2 (where $G_{LOOP}$ is the loop gain, $G_{M1}$ is the gain of transistor M1, B is the operational amplifier gain and $R_{LOAD}$ is the load resistance), forces the potential of the gate terminal of P-MOSFET M2 to ground potential GND. This causes the circuit to not be biased properly and, therefore, unable to function as desired.

$$G_{Loop} = G_{M1} * B * R_{LOAD} \tag{2}$$

Referring to FIG. 3, with a DC bias loop, however, the potentials of the gate terminals can be established at a higher voltage than ground GND and the amplifier can be properly biased. However, in order to get a good low frequency response, the components in the low pass filter (resistors R1 and R2 and capacitor C1) must be high in value and, therefore, relatively large in size and thus implemented as external components. Moreover, due to the large capacitance of the LPF capacitor C1, a long start-up time is required (e.g., approximately one second).

SUMMARY OF THE INVENTION

A self-biased, phantom-powered and feedback-stabilized amplifier for an electret microphone in accordance with the present invention does not require a DC bias loop, and combines the simple and fast DC bias characteristics of the conventional JFET circuit, as well as the improved gain, dynamic range, linearity and temperature stability of a feedback amplifier.

In accordance with one embodiment of the present invention, a self-biased, phantom-powered and feedback-stabilized amplifier for an electret microphone includes a power and signal terminal, a reference terminal, a current source circuit, a differential FET amplifier circuit, a diode and a feedback amplifier circuit. The power and signal terminal is configured to couple to a dc power source via a load impedance and to an output signal circuit, convey dc power at a dc power voltage from the dc power source and convey an amplified signal to the output signal circuit. The reference terminal is configured to couple and provide a return dc path at a dc reference voltage to the dc power source and to couple to an electrode of an electret microphone. The current source circuit is coupled to the power and signal terminal and is configured to receive a portion of the dc power and provide a tail current. The differential FET amplifier circuit includes: a first input terminal configured to couple to the other electrode of the electret microphone and receive a microphone signal therefrom; a second input terminal configured to receive a feedback signal at a quiescent feedback voltage between the dc power voltage and the dc reference voltage; a tail circuit portion coupled to the current source circuit and configured to receive the tail current; and an output circuit portion coupled to the reference terminal and configured to provide a differential signal corresponding to a difference between the microphone signal and the feedback signal. The diode is coupled between the first input terminal and the reference terminal. The feedback amplifier circuit is coupled between the output circuit portion, the power and signal terminal and the reference terminal and is configured to receive the differential signal and another portion of the dc power and in accordance therewith provide the amplified signal and the feedback signal at the quiescent feedback voltage, wherein the amplified signal corresponds to the microphone signal.

In accordance with another embodiment of the present invention, a self-biased, phantom-powered and feedback-stabilized amplifier for an electret microphone includes a phantom power output terminal, a reference terminal, a FET amplifier circuit and a feedback amplifier circuit. The phantom power output terminal is configured to couple to a dc power source via a load impedance and to an output signal circuit, convey dc power at a dc power voltage from the dc power source and convey an amplified signal to the output signal circuit. The reference terminal is configured to couple and provide a return dc path at a dc reference voltage to the dc power source and to couple to an electrode of an electret microphone. The FET amplifier circuit includes: a power input terminal configured to receive a portion of the dc power; a self-bias input terminal configured to couple to the other electrode of the electret microphone and receive a microphone signal therefrom; a feedback input terminal configured to receive a feedback input signal at a quiescent feedback voltage between the dc power voltage and the dc reference voltage; and a differential feedback output terminal configured to provide a differential feedback signal. The feedback amplifier circuit, coupled to the FET amplifier circuit, the phantom power output terminal and the circuit reference terminal, is configured to receive the differential feedback signal and another portion of the dc power and in accordance therewith provide the amplified signal and the feedback input signal at the quiescent feedback voltage, wherein the amplified signal corresponds to the microphone signal.

These and other features and advantages of the present invention will be understood upon consideration of the following detailed description of the invention and the accompanying drawings.

BRIEF DESCRIPTION OF THE DRAWINGS

FIG. 4A is a functional block diagram of the tail current source of FIG. 4 implemented as a current mirror circuit.

FIG. 4B is a functional block diagram of the tail current source of FIG. 4 implemented with bandgap and current generator circuits.

FIG. 5 is a more detailed schematic diagram of one embodiment of the circuit of FIG. 4.

DETAILED DESCRIPTION OF THE INVENTION

Figure 1:
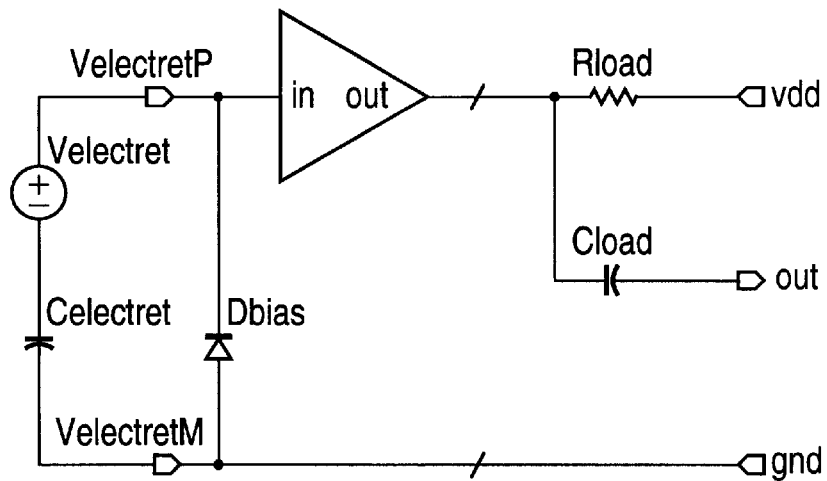
FIG. 1 is a schematic diagram of a conventional buffer amplifier circuit with phantom powering for an electret microphone.
Figure 2:
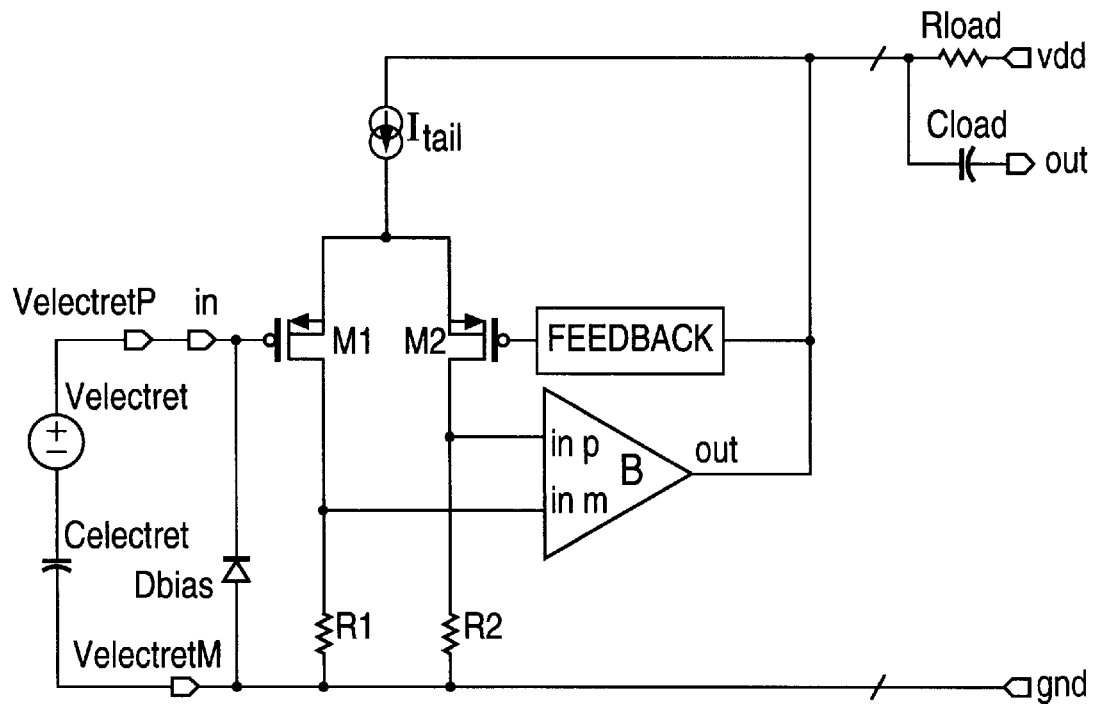
FIG. 2 is a schematic diagram of a conventional buffer amplifier circuit for replacing the conventional JFET design but having undesirable performance characteristics.
Figure 3:
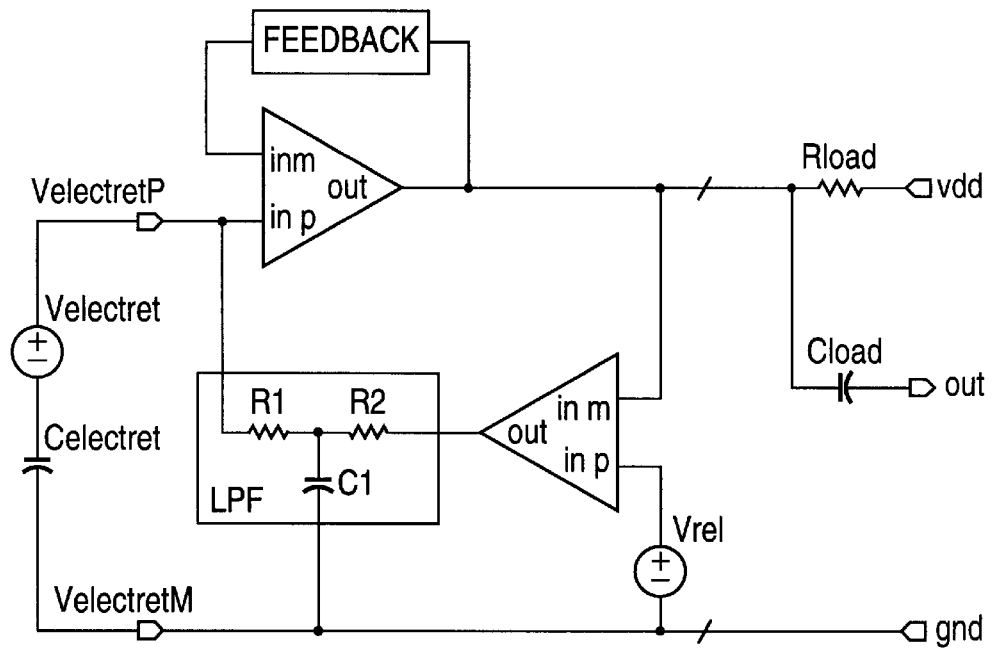
FIG. 3 is a schematic diagram of a conventional buffer amplifier circuit with a DC bias loop which includes low pass filtering.
Figure 4:
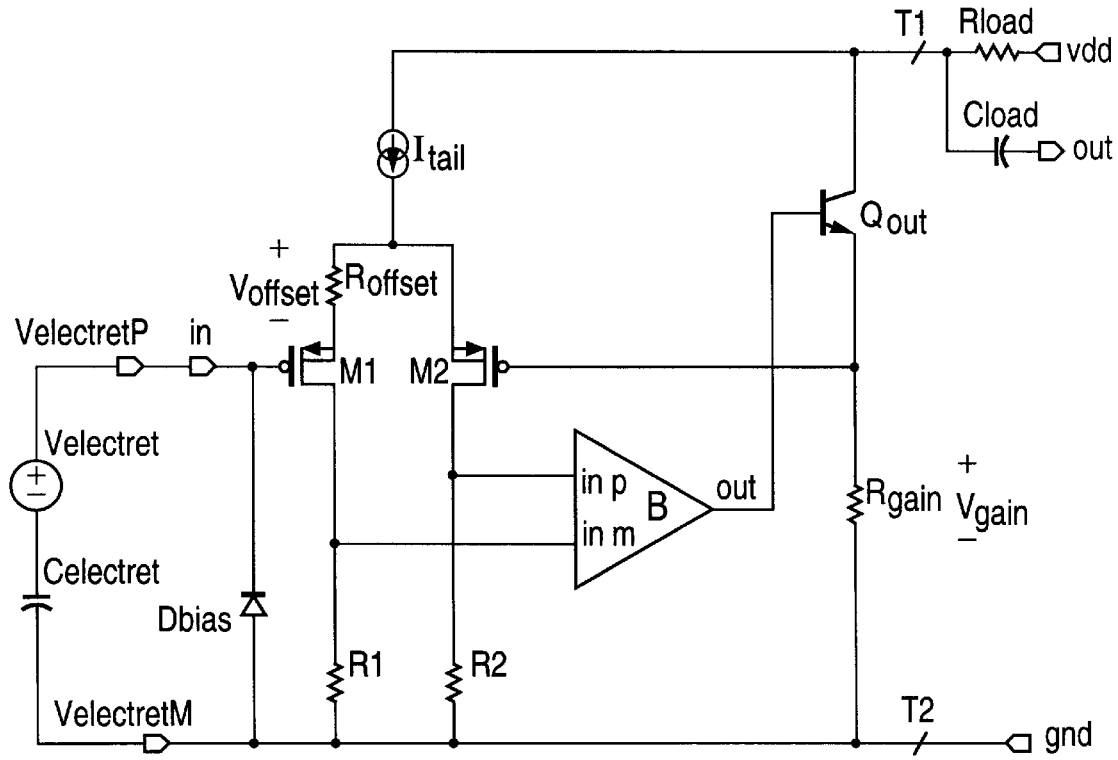
FIG. 4 is a schematic diagram of a self-biased, phantom-powered and feedback-stabilized amplifier for an electret microphone in accordance with one embodiment of the present invention.

Referring to FIG. 4, a self-biased, phantom-powered and feedback-stabilized amplifier for an electret microphone in accordance with one embodiment of the present invention is self-biased in a manner similar to a conventional JFET amplifier and provides the stabilized performance of a feedback amplifier. The phantom power terminal T1 connects to the power supply VDD via the load resistor Rload and to an output terminal for providing the amplified microphone signal Out via a coupling capacitor Cload. The reference terminal T2 completes the return DC path to the reference terminal GND of the power supply.

A current source circuit Itail generates and provides a tail current Itail to a differential amplifier composed of P-MOSFETs M1 and M2, offset resistor Roffset and load resistors R1 and R2, as shown. Transistor M1 is self-biased at its gate terminal with a shunt-connected bias diode Dbias. The electret microphone, in accordance with conventional principles, is connected across the bias diode Dbias. The inverting INM and non-inverting INP terminals of an operational amplifier (opamp) B are connected to the drain terminals of transistors M1 and M2, respectively. The output of the opamp B drives the base of an NPN bipolar junction transistor Qout. The collector of transistor Qout provides the output signal Out across the load resistor Rload via the coupling capacitor Cload. The emitter of transistor Qout provides a feedback signal to the gate terminal of transistor M2. Hence, transistor Qout, in conjunction with the load resistor Rload (and coupling capacitor Cload) and emitter resistance Rgain, operates as a non-inverting amplifier for the feedback signal to the gate terminal of transistor M2 while operating as an inverting amplifier for the amplified output signal Out.

The offset resistor Roffset introduces a well controlled offset voltage Voffset within the input branch of the tail circuit of the M1/M2 amplifier circuit. This offset is a function of the tail current Itail and the offset resistance Roffset, with the tail current Itail being a bandgap current constant current generated in accordance with well known techniques, such as with a current mirror circuit (FIG. 4A) or as a generated by a bandgap reference circuit (FIG. 4B; many of which are well known in the art), in accordance with Equations 3 and 4.

$$Voffset = 0.5 * Itail * Roffset \quad (3)$$

$$Itail = \frac{Vbandgap}{Rbandgap} \quad (4)$$

Since the offset voltage Voffset depends only upon the bandgap reference voltage Vbandgap and the ratio of the offset Roffset and bandgap Rbandgap resistors, it will be very accurate, in accordance with Equation 5.

$$Voffset = \frac{Vbandgap}{2} * \frac{Roffset}{Rbandgap} \quad (5)$$

Due to self-biasing, the diode Dbias keeps the gate terminal of transistor M1 at the reference, or ground GND, potential. Meanwhile, due to the feedback provided by opamp B and output transistor Qout, the voltage at the gate terminal of transistor M2 and, therefore, across resistor Rgain, will equal the offset voltage Voffset. This voltage relationship establishes the quiescent current Iquiescent through output transistor Qout, in accordance with Equation 6.

$$I_{quiescent} = \frac{V_{offset}}{R_{gain}} \quad (6)$$

The small signal gain (Gain) for the output stage is established by the ratio of the load resistor Rload to resistor Rgain, in accordance with Equation 7.

$$Gain = \frac{R_{load}}{R_{gain}} \quad (7)$$

Referring to FIG. 5, the circuit of FIG. 4 has been simulated with the opamp B being implemented with transistors Q1, Q2, Q3, Q4, Q6, Qcas1 and Qcas2, capacitors C1, C2 and C3, and current sources I1, I2, I3 and I4, substantially as shown. Simulations have shown that this circuit has a start-up time similar to a conventional JFET amplifier circuit, but with total harmonic distortion less than one percent at 600 millivolts of output voltage and with gain which is very accurate over temperature and from one circuit to another.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a self-biased, phantom-powered and feedback-stabilized amplifier for an electret microphone, comprising:

a power and signal terminal configured to couple to a dc power source via a load impedance and to an output signal circuit, convey dc power at a dc power voltage from said dc power source and convey an amplified signal to said output signal circuit;

a reference terminal configured to couple and provide a return dc path at a dc reference voltage to said dc power source and to couple to a first electrode of an electret microphone;

a current source circuit coupled to said power and signal terminal and configured to receive a portion of said dc power and provide a tail current;

a differential FET amplifier circuit which includes a first input terminal configured to couple to a second electrode of said electret microphone and receive a microphone signal therefrom, a second input terminal configured to receive a feedback signal at a quiescent feedback voltage between said dc power voltage and said dc reference voltage, a tail circuit portion coupled to said current source circuit and configured to receive said tail current, an output circuit portion coupled to said reference terminal and configured to provide a differential signal corresponding to a difference between said microphone signal and said feedback signal;

a diode coupled between said first input terminal and said reference terminal; and a feedback amplifier circuit coupled between said output circuit portion, said power and signal terminal and said reference terminal and configured to receive said differential signal and another portion of said dc power and in accordance therewith provide said amplified signal and said feedback signal at said quiescent feedback voltage, wherein said amplified signal corresponds to said microphone signal.

2. The apparatus of claim 1, wherein said current source circuit comprises a current mirror circuit.

3. The apparatus of claim 1, wherein said current source circuit comprises:

a bandgap circuit configured to generate a bandgap reference signal; and a current generator circuit coupled to said bandgap circuit and configured to receive said bandgap reference signal and in accordance therewith provide said tail current.

4. The apparatus of claim 1, wherein said differential FET amplifier circuit comprises a differential MOSFET amplifier circuit.

5. The apparatus of claim 4, wherein said differential MOSFET amplifier circuit comprises a plurality of enhancement mode MOSFETs.

6. The apparatus of claim 1, wherein said diode is configured to be reverse biased by said electret microphone.

7. The apparatus of claim 1, wherein:

said tail circuit portion includes a first resistor configured to conduct a quiescent portion of said tail current and in accordance therewith generate a quiescent tail voltage across said first resistor;

said feedback amplifier circuit includes a second resistor configured to conduct a quiescent output current and in accordance therewith generate said quiescent feedback voltage across said second resistor; and said quiescent tail and feedback voltages are substantially equal.

8. The apparatus of claim 7, wherein said second resistor is further configured to conduct a signal output current and in accordance therewith generate said feedback signal.

9. The apparatus of claim 1, wherein said feedback amplifier circuit includes an output stage configured to operate as:

a noninverting amplifier in generating said feedback signal; and an inverting amplifier in generating said amplified signal.

10. The apparatus of claim 1, wherein:

said load impedance includes a load resistor;

said feedback amplifier circuit includes an output resistor; and a ratio of said amplified signal to said microphone signal is substantially equal to a ratio of said load resistor to said output resistor.

11. An apparatus including a self-biased, phantom-powered and feedback-stabilized amplifier for an electret microphone, comprising:

a phantom power output terminal configured to couple to a dc power source via a load impedance and to an output signal circuit, convey dc power at a dc power voltage from said dc power source and convey an amplified signal to said output signal circuit;

a reference terminal configured to couple and provide a return dc path at a dc reference voltage to said dc power source and to couple to a first electrode of an electret microphone;

a FET amplifier circuit which includes a power input terminal configured to receive a portion of said dc power, a self-bias input terminal configured to couple to a second electrode of said electret microphone and receive a microphone signal therefrom, a feedback input terminal configured to receive a feedback input signal at a quiescent feedback voltage between said dc power voltage and said dc reference voltage, and a differential feedback output terminal configured to provide a differential feedback signal; and a feedback amplifier circuit, coupled to said FET amplifier circuit, said phantom power output terminal and said circuit reference terminal, configured to receive said differential feedback signal and another portion of said dc power and in accordance therewith provide said amplified signal and said feedback input signal at said quiescent feedback voltage, wherein said amplified signal corresponds to said microphone signal.

12. The apparatus of claim 11, wherein said FET amplifier circuit comprises a differential MOSFET amplifier circuit.

13. The apparatus of claim 12, wherein said differential MOSFET amplifier circuit comprises a plurality of enhancement mode MOSFETs.

14. An apparatus including a self-biased, phantom-powered and feedback-stabilized amplifier for an electret microphone, comprising:

a phantom power output terminal configured to couple to a dc power source via a load impedance and to an output signal circuit, convey dc power at a dc power voltage from said dc power source and convey an amplified signal to said output signal circuit;

a reference terminal configured to couple and provide a return dc path at a dc reference voltage to said dc power source and to couple to a first electrode of an electret microphone;

a FET amplifier circuit which includes
  a power input terminal configured to receive a portion of said dc power,
  a self-bias input terminal configured to couple to a second electrode of said electret microphone and receive a microphone signal therefrom,
  a feedback input terminal configured to receive a feedback input signal at a quiescent feedback voltage between said dc power voltage and said dc reference voltage, and
  a differential feedback output terminal configured to provide a differential feedback signal;

a feedback amplifier circuit, coupled to said FET amplifier circuit, said phantom power output terminal and said circuit reference terminal, configured to receive said differential feedback signal and another portion of said dc power and in accordance therewith provide said amplified signal and said feedback input signal at said quiescent feedback voltage, wherein said amplified signal corresponds to said microphone signal; and a diode, coupled between said self-bias input terminal and said reference terminal, configured to be reverse biased by said electret microphone.

15. An apparatus including a self-biased, phantom-powered and feedback-stabilized amplifier for an electret microphone, comprising:

a phantom power output terminal configured to couple to a dc power source via a load impedance and to an output signal circuit, convey dc power at a dc power voltage from said power source and convey an amplified signal to said output signal circuit;

a reference terminal configured to couple and provide a return dc path at a dc reference voltage to said dc power source and to couple to a first electrode of an electret microphone;

a FET amplifier circuit which includes
  a power input terminal configured to receive a portion of said dc power,
  a self-bias input terminal configured to couple to a second electrode of said electret microphone and receive a microphone signal therefrom,
  a feedback input terminal configured to receive a feedback input signal at a quiescent feedback voltage between said dc power voltage and said dc reference voltage, and
  a differential feedback output terminal configured to provide a differential feedback signal; and a feedback amplifier circuit, coupled to said FET amplifier circuit, said phantom power output terminal and said circuit reference terminal, configured to receive said differential feedback signal and another portion of said dc power and in accordance therewith provide said amplified signal and said feedback input signal at said quiescent feedback voltage, wherein said amplified signal corresponds to said microphone signal;

wherein:
  said FET amplifier circuit includes a first resistor configured to conduct a quiescent power current and in accordance therewith generate a quiescent amplifier voltage across said first resistor;
  said feedback amplifier circuit includes a second resistor configured to conduct a quiescent output current and in accordance therewith generate said quiescent feedback voltage across said second resistor; and
  said quiescent amplifier and feedback voltages are substantially equal.

16. The apparatus of claim 15, wherein said second resistor is further configured to conduct a signal output current and in accordance therewith generate said feedback input signal.

17. An apparatus including a self-biased, phantom-powered and feedback-stabilized amplifier for an electret microphone, comprising:

a phantom power output terminal configured to couple to a dc power source via a load impedance and to an output signal circuit, convey dc power at a dc power voltage from said dc power source and convey an amplified signal to said output signal circuit;

a reference terminal configured to couple and provide a return dc path at a dc reference voltage to said dc power source and to couple to a first electrode of an electret microphone;

a FET amplifier circuit which includes
  a power input terminal configured to receive a portion of said dc power,
  a self-bias input terminal configured to couple to a second electrode of said electret microphone and receive a microphone signal therefrom,
  a feedback input terminal configured to receive a feedback input signal at a quiescent feedback voltage between said dc power voltage and said dc reference voltage, and
  a differential feedback output terminal configured to provide a differential feedback signal; and a feedback amplifier circuit, coupled to said FET amplifier circuit, said phantom power output terminal and said circuit reference terminal, configured to receive said differential feedback signal and another portion of said dc power and in accordance therewith provide said amplified signal and said feedback input signal at said quiescent feedback voltage, wherein said amplified signal corresponds to said microphone signal;

wherein said feedback amplifier circuit includes and output stage configured to operate as:
  a noninverting amplifier in generating said feedback input signal; and
  an inverting amplifier in generating said amplified signal.

18. An apparatus including a self-biased, phantom-powered and feedback-stabilized amplifier for an electret microphone, comprising:

a phantom power output terminal configured to couple to a dc power source via a load impedance and to an output signal circuit, convey dc power at a dc power voltage from said dc power source and convey an amplified signal to said output signal circuit;

a reference terminal configured to couple and provide a return dc path at a dc reference voltage to said dc power source and to couple to a first electrode of an electret microphone;

a FET amplifier circuit which includes
  a power input terminal configured to receive a portion of said dc power,
  a self-bias input terminal configured to couple to a second electrode of said electret microphone and receive a microphone signal therefrom,
  a feedback input terminal configured to receive a feedback input signal at a quiescent feedback voltage between said dc power voltage and said dc reference voltage, and
  a differential feedback output terminal configured to provide a differential feedback signal; and a feedback amplifier circuit, coupled to said FET amplifier circuit, said phantom power output terminal and said circuit reference terminal, configured to receive said differential feedback signal and another portion of said dc power and in accordance therewith provide said amplified signal and said feedback input signal at said quiescent feedback voltage, wherein said amplified signal corresponds to said microphone signal;

wherein:
  said load impedance includes a load resistor;
  said feedback amplifier circuit includes an output resistor; and
  a ratio of said amplified signal to said microphone signal is substantially equal to a ratio of said load resistor to said output resistor.

* * * * *

UNITED STATES PATENT AND TRADEMARK OFFICE
CERTIFICATE OF CORRECTION

PATENT NO : 6,160,450

DATED : December 12, 2000

INVENTOR(S) : Eschauzier et al.

It is certified that error appears in the above-identified patent and that said Letters Patent is hereby corrected as shown below:

On the cover page, at [75], please delete "Nico van Riin" and replace with --Nico van Rijn--.

Signed and Sealed this

Twenty-ninth Day of May, 2001

*Attest:*

NICHOLAS P. GODICI

*Attesting Officer*            *Acting Director of the United States Patent and Trademark Office*